(12) United States Patent
Yoshikawa et al.

(10) Patent No.: US 7,691,546 B2
(45) Date of Patent: Apr. 6, 2010

(54) PHOTOMASK BLANK AND PHOTOMASK

(75) Inventors: Hiroki Yoshikawa, Joetsu (JP); Yukio Inazuki, Joetsu (JP); Satoshi Okazaki, Joetsu (JP); Takashi Haraguchi, Tokyo (JP); Masahide Iwakata, Tokyo (JP); Mikio Takagi, Tokyo (JP); Yuichi Fukushima, Tokyo (JP); Tadashi Saga, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 488 days.

(21) Appl. No.: 11/662,183

(22) PCT Filed: Sep. 8, 2005

(86) PCT No.: PCT/JP2005/016511
§ 371 (c)(1),
(2), (4) Date: Mar. 8, 2007

(87) PCT Pub. No.: WO2006/028168
PCT Pub. Date: Mar. 16, 2006

(65) Prior Publication Data
US 2008/0063950 A1 Mar. 13, 2008

(30) Foreign Application Priority Data
Sep. 10, 2004 (JP) ............................. 2004-263161

(51) Int. Cl.
*G03F 1/00* (2006.01)
(52) U.S. Cl. ......................................................... 430/5
(58) Field of Classification Search ..................... 430/5, 430/322, 323, 394; 378/35; 428/428, 430
See application file for complete search history.

(56) References Cited

U.S. PATENT DOCUMENTS

| 5,474,864 | A | 12/1995 | Isao et al. |
| 5,629,114 | A | 5/1997 | Isao et al. |
| 5,674,647 | A | 10/1997 | Isao et al. |
| 5,691,090 | A | 11/1997 | Isao et al. |
| 5,830,607 | A | 11/1998 | Isao et al. |
| 6,599,667 | B2 | 7/2003 | Yusa et al. |
| 6,762,000 | B2 | 7/2004 | Nozawa et al. |
| 7,179,545 | B2 * | 2/2007 | Okazaki et al. ............. 428/697 |
| 2001/0014425 | A1 | 8/2001 | Mitsui et al. |

(Continued)

FOREIGN PATENT DOCUMENTS
EP 1 152 292 A2 11/2001
(Continued)

*Primary Examiner*—Stephen Rosasco
(74) *Attorney, Agent, or Firm*—Birch, Stewart, Kolasch & Birch, LLP

(57) ABSTRACT

A photomask blank to be used as a material for a photomask is provided with a mask pattern having a transparent area and an effectively opaque area to exposure light on a transparent substrate. On the transparent board, one or more layers of light shielding films are formed with or without other film (A) in between, at least one layer (B) which constitutes the light shielding film includes silicon and a transition metal as main component, and a molar ratio of silicon to the transition metal is silicon:metal=4-15:1 (atomic ratio). The photomask provided with the mask pattern having the transparent area and the effectively opaque area to exposure light on the transparent board is also provided.

8 Claims, 3 Drawing Sheets

U.S. PATENT DOCUMENTS

2004/0072016 A1  4/2004  Okazaki et al.
2004/0197674 A1* 10/2004 Bailey et al. .................. 430/5

FOREIGN PATENT DOCUMENTS

| JP | 61-173253 A | 8/1986 |
|----|-------------|--------|
| JP | 63-85553 A | 4/1988 |
| JP | 1-142637 A | 6/1989 |
| JP | 3-116147 A | 5/1991 |
| JP | 4-246649 A | 9/1992 |
| JP | 6-102656 A | 4/1994 |
| JP | 7-140635 A | 6/1995 |
| JP | 11-316454 A | 11/1999 |
| JP | 2001-312043 A | 11/2001 |
| JP | 2002-14458 A | 1/2002 |
| JP | 2002-90977 A | 3/2002 |
| JP | 3093632 U | 2/2003 |
| JP | 2003-195479 A | 7/2003 |
| JP | 2003-195483 A | 7/2003 |

* cited by examiner

PHOTOMASK BLANK AND PHOTOMASK

TECHNICAL FIELD

This invention relates to photomask blanks and photomasks for use in the microfabrication of semiconductor integrated circuits, charge coupled devices (CCD), liquid crystal display (LCD) color filters, magnetic heads or the like.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light exposed. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical and proximity correction (OPC) is applied. Then, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography used in a semiconductor processing step using a photomask.

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shielding pattern. In an attempt to miniaturize the light-shielding pattern, if processing is carried out while maintaining the thickness of the resist film at the same level as in the prior art prior to the miniaturization, the ratio of film thickness to pattern, known as aspect ratio, becomes higher. As a result, the resist pattern profile is degraded, preventing effective pattern transfer, and in some cases, there occurs resist pattern collapse or stripping. Therefore, the miniaturization must entail a thickness reduction of resist film.

As to the light-shielding film material which is etched using the resist as an etch mask, on the other hand, a number of materials have been proposed. In practice, chromium compound films are always employed because there are known a number of studies with respect to their etching and the standard process has been established. Typical of such films are light-shielding films composed of chromium compounds necessary for photomask blanks for ArF excimer laser lithography, which include chromium compound films with a thickness of 50 to 77 nm as reported in JP-A 2003-195479 (Patent Reference 1), JP-A 2003-195483 (Patent Reference 2), and Japanese Patent No. 3093632 (Patent Reference 3).

However, oxygen-containing chlorine dry etching which is a common dry etching process for chromium based films such as chromium compound films often has a capability of etching organic films to some extent. If etching is carried out through a thin resist film, accurate transfer of the resist pattern is difficult. It is a task of some difficulty for the resist to have both a high resolution and etch resistance that allows for high accuracy etching. Then, for the purpose of achieving high resolution and high accuracy, the light-shielding film material has to be reviewed so as to find a transition from the approach relying only on the resist performance to the approach of improving the light-shielding film performance as well.

Also, as to light-shielding film materials other than the chromium based materials, a number of studies have been made. One example of the latest studies is the use of tantalum in the light-shielding film for ArF excimer laser lithography. See JP-A 2001-312043 (Patent Reference 4).

On the other hand, it has long been a common practice to use a hard mask for reducing the load on resist during dry etching. For example, JP-A 63-85553 (Patent Reference 5) discloses $MoSi_2$ overlaid with a $SiO_2$ film, which is used as an etch mask during dry etching of $MoSi_2$. It is described that the $SiO_2$ film can also function as an antireflective film.

From the past, studies have been made on metal silicide films, especially molybdenum silicide films, which can be readily etched under etching conditions for fluorine dry etching that causes few damages to resist film. They are disclosed, for example, in JP-A 63-85553 (Patent Reference 5), JP-A 1-142637 (Patent Reference 6), and JP-A 3-116147 (Patent Reference 7), all of which basically use a film of silicon and molybdenum=2:1. Also, JP-A 4-246649 (Patent Reference 8) discloses a metal silicide film. All these metal silicide films have insufficient chemical stability to chemical cleaning as the final step of the photomask fabrication process, and particularly when the films are made thin, may lose the physical properties the film should maintain during the cleaning step.

Patent Reference 1: JP-A 2003-195479
Patent Reference 2: JP-A 2003-195483
Patent Reference 3: Japanese Patent 3093632
Patent Reference 4: JP-A 2001-312043
Patent Reference 5: JP-A 63-85553
Patent Reference 6: JP-A 1-142637
Patent Reference 7: JP-A 3-116147
Patent Reference 8: JP-A 4-246649
Patent Reference 9: JP-A 7-140635

DISCLOSURE OF THE INVENTION

Problem to be Solved by the Invention

The present invention has been made in order to solve the above problems, and its object is to provide a photomask blank which endows a photomask with both a high resolution and a high accuracy etching capability for forming a finer photomask pattern, especially as needed in the photolithography involving exposure to light of a wavelength equal to or less than 250 nm such as ArF excimer laser light, i.e., a photomask blank comprising a light-shielding film which can be etched without any substantial load to the resist during etching operation and which has sufficient chemical stability during the mask cleaning step requisite in the photomask manufacture process; and a photomask having a mask pattern formed using the photomask blank.

Means for Solving the Problem

Making extensive investigations to solve the outstanding problems, the inventor has found that a film containing silicon and a transition metal in a specific ratio has higher light-shielding property to exposure light of a wavelength equal to or less than 250 nm, especially ArF excimer laser light, than the chromium based films which are used in the art, and that although the chemical stability is believed low in the art, it is chemically stable when the ratio falls in the specific range. The invention is predicated on this finding.

Accordingly, the present invention provides a photomask blank and a photomask as defined below.

Claim 1:
A photomask blank from which is produced a photomask comprising a transparent substrate and a mask pattern formed thereon including transparent regions and effectively opaque regions to exposure light, characterized in that a light-shielding film of one or more layers is formed on a transparent substrate with or without another film (A) intervening therebetween, at least one layer (B) of the layers of which the light-shielding film is composed contains silicon and a transition metal as main components, and the silicon and the transition metal are present at a silicon/metal molar ratio of 4-15:1 (atomic ratio).

Claim 2:
The photomask blank of claim 1, wherein the transition metal is molybdenum.

Claim 3:
The photomask blank of claim 1 or 2, wherein the at least one layer (B) of the layers of which the light-shielding film is composed further contains at least one element selected from oxygen, nitrogen and carbon.

Claim 4:
The photomask blank of any one of claims 1 to 3, wherein said light-shielding film has a thickness of 20 to 50 nm.

Claim 5:
The photomask blank of any one of claims 1 to 4, wherein said light-shielding film is overlaid with an antireflective film, and the antireflective film contains as a main component a transition metal silicide oxide, transition metal silicide nitride, transition metal silicide oxynitride, transition metal silicide oxycarbide, transition metal silicide carbonitride or transition metal silicide oxide nitride carbide.

Claim 6:
The photomask blank of claim 5, wherein the transition metal silicide is molybdenum silicide.

Claim 7:
The photomask blank of any one of claims 1 to 4, wherein said light-shielding film is overlaid with an antireflective film, and the antireflective film contains as a main component a chromium oxide, chromium nitride, chromium oxynitride, chromium oxycarbide, chromium carbonitride or chromium oxide nitride carbide.

Claim 8:
The photomask blank of any one of claims 1 to 7, wherein the other film (A) comprises a phase shift film.

Claim 9:
A photomask comprising a transparent substrate and a mask pattern formed thereon including transparent regions and effectively opaque regions to exposure light, which is produced from the photomask blank of any one of claims 1 to 8.

In the invention, an antireflective film may be disposed on the light-shielding film. In one embodiment wherein the antireflective film is made of a transition metal silicide compound such as a transition metal silicide oxide, transition metal silicide nitride, transition metal silicide oxynitride, transition metal silicide oxycarbide, transition metal silicide carbonitride or transition metal silicide oxide nitride carbide, the light-shielding film and the antireflective film can be etched by fluorine dry etching, ensuring very high etching processability.

In another embodiment wherein the antireflective film is made of a chromium compound such as a chromium oxide, chromium nitride, chromium oxynitride, chromium oxycarbide, chromium carbonitride or chromium oxide nitride carbide, the light-shielding film and the antireflective film are such that they can be fully processed using a thin resist film. They can be processed without substantial damage to the resist, and the chemical stability during cleaning is satisfactory.

BENEFITS OF THE INVENTION

The photomask blank having a light-shielding film as constructed according to the invention is a photomask blank having a light-shielding film possessing high light-shielding property and chemical stability, which can be etched or processed under sufficient etching conditions or within a sufficient etching time to minimize the damage to the resist during etching, even when the light-shielding film is overlaid with an antireflective film. Then the resist can be formed relatively thin, thereby avoiding the problems associated with an increase of resist film aspect ratio and enabling higher accuracy photomask pattern formation.

BEST MODE FOR CARRYING OUT THE INVENTION

Figure 1:
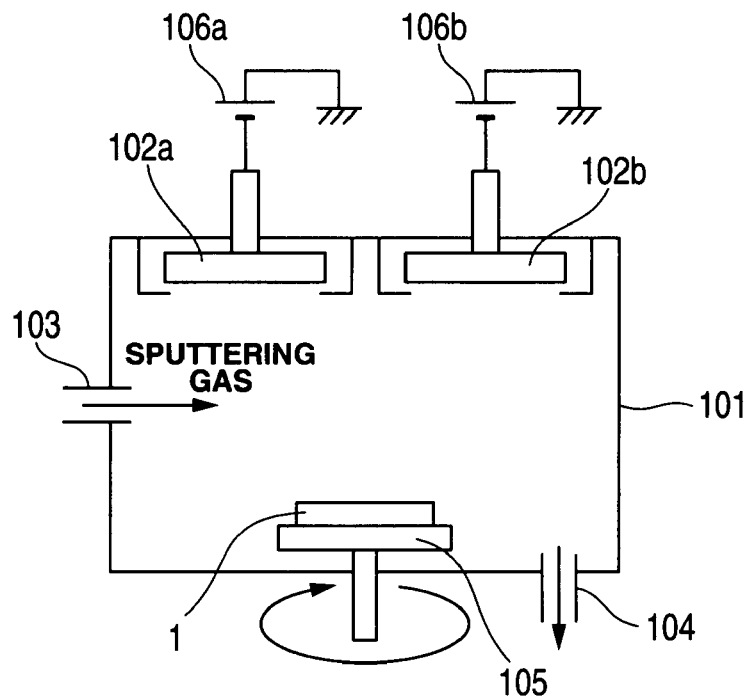
FIG. 1 is a schematic view showing a DC sputtering apparatus having two targets used in Examples.

Now the invention is described in further detail.

From the photomask blank of the invention is produced a photomask comprising a transparent substrate and a mask pattern formed thereon including transparent regions which are transparent to exposure light and regions which are effectively opaque to exposure light, that is, sufficiently opaque to provide a practical light shield when used in pattern exposure as a photomask. The photomask blank is constructed by forming a light-shielding film of one or more layers on a transparent substrate with or without another film intervening therebetween. At least one layer of the layers of which the light-shielding film is composed contains silicon and a transition metal as main components, and the silicon and the transition metal are present at a silicon/metal molar ratio of 4-15:1 (atomic ratio).

In the photomask blank of the invention, the light-shielding film may be either a single layer film or a multilayer film. At least one layer of the layers of which the light-shielding film is composed should contain silicon and a transition metal, wherein the silicon and the transition metal are present at a silicon/metal molar ratio of 4-15:1 (atomic ratio), that is, between 4:1 and 15:1 (atomic ratio). In particular, a single layer film is preferred in order to provide higher processability. For the multilayer film, it is preferred that all the layers of which the light-shielding film is composed contain silicon and a transition metal as main components wherein the silicon and the transition metal are present at a silicon/metal molar ratio of 4-15:1 (atomic ratio). It is noted for the multilayer film that a tungsten layer, tantalum layer or the like may be formed as a layer other than the silicon and transition metal-containing layer, specifically between the silicon and transition metal-containing layer and the transparent substrate.

The light-shielding film must have such chemical stability that it undergoes no thickness changes during cleaning. For the ArF lithography photomask application, a film thickness change equal to or less than 3 nm during cleaning is required. It is to be noted that the light-shielding film can be damaged under conditions of cleaning requisite to the photomask manufacture process, especially cleaning with a sulfuric acid-hydrogen peroxide mixture (SPM) so that the light-shielding performance is lost. Also attention should be paid to the electric conductivity of the film in order to avoid the film from charging-up upon exposure to electron beam in the lithography step for mask pattern formation. The light-shielding film of the invention wherein the molar ratio of silicon to transition metal is within the above-specified range ensures that a light-shielding film has a chemical stability and electric conductivity falling within the ranges of practically acceptable physical properties.

Examples of suitable transition metals of which the light-shielding film is composed include molybdenum, tantalum, tungsten, cobalt, nickel, vanadium, titanium, niobium, zirconium, hafnium, and the like. Molybdenum is most preferred for dry etching processability.

In order that a film deposited on a photomask function as a film having sufficient light-shielding ability, in the case of a commonly used binary mask blank comprising a light-shielding film and an antireflective film, the combination of light-shielding film and antireflective film, and in the case of a halftone phase shift mask blank, the combination of a halftone phase shift film, light-shielding film and antireflective film should have an optical density OD of at least 2.5, specifically at least 2.8, more specifically at least 3.0 relative to exposure light. Then, the film containing silicon and transition metal as main components may consist essentially of silicon and transition metal, or may further contain light elements such as oxygen, nitrogen, carbon or the like as additional components. Since sufficient light-shielding is not available sometimes when these light elements are contained above a certain level, it is desired for a preferred embodiment of the inventive photomask blank, i.e., a photomask blank adapted for ArF excimer laser lithography at wavelength 193 nm that the nitrogen and carbon contents each be equal to or less than 20 atom % and the oxygen content be equal to or less than 10 atom %, and especially the total content of nitrogen, carbon, and oxygen be equal to or less than 40 atom %.

Also, the light-shielding film preferably has a thickness of 20 to 50 nm. At a film thickness less than 20 nm, sufficient light-shielding effect is not available in some cases. In excess of 50 nm, high accuracy processing with a thin resist having a thickness equal to or less than 250 nm may become difficult, or film stress may cause warpage to the substrate.

The light-shielding film can be formed by well-known methods. Film formation by sputtering is commonly used as the simplest method of forming a homogeneous film, and the sputtering is the preferred film formation method in the present invention as well. The target used may be a single target containing silicon and transition metal in a controlled ratio from 4:1 to 15:1. Alternatively, a ratio of silicon to transition metal may be adjusted by selecting appropriate ones from a silicon target, a transition metal target, and targets of silicon and transition metal (transition metal silicide targets) and controlling the sputtering area of the selected targets or the power applied to the selected targets. It is noted that when the light-shielding film contains light elements such as oxygen, nitrogen, and carbon, such a film can be deposited by reactive sputtering wherein an oxygen-containing gas, nitrogen-containing gas or carbon-containing gas is added to the sputtering gas as a reactive gas.

In the practice of the invention, the light-shielding film described above may be overlaid with an antireflective film. Generally the antireflective film used herein may be any of well-known films although the following two embodiments are often used for processability.

One embodiment is an antireflective film which is suitable when the antireflective film and the light-shielding film are simultaneously etched using the resist as an etch mask. This antireflective film contains as a main component a transition metal silicide compound such as a transition metal silicide oxide, transition metal silicide nitride, transition metal silicide oxynitride, transition metal silicide oxycarbide, transition metal silicide carbonitride, transition metal silicide oxide nitride carbide and the like. As the transition metal used herein, the exemplary transition metals illustrated for the light-shielding film are preferred again. For etching processability, the transition metal used herein is preferably the same as in the light-shielding film, with molybdenum being most preferred.

In this embodiment, the antireflective film preferably has an atomic composition which is set to the range of 0.2 to 25 atom % transition metal, 10 to 57 atom % Si, 0 to 60 atom % O, 0 to 57 atom % N, and 0 to 30 atom % C, and to provide an optical density OD between 0.3 and 1.5, preferably between 0.5 and 1.0, relative to exposure light when its thickness is within the range described below. Although the thickness of the antireflective film varies with the wavelength of light used for inspection necessary during fabrication or use of the photomask, the antireflection effect is generally exerted at a thickness of 15 to 30 nm. A thickness of 20 to 25 nm is preferred especially for the ArF excimer laser lithography.

Since the antireflective film has dry etching characteristics equivalent to those of the light-shielding film, the light-shielding film and the antireflective film can be etched in a single step to form a light-shielding pattern.

The antireflective film can be formed by well-known methods. The method often used herein is by selecting an appropriate target or targets from a silicon target, transition metal target, and silicon and transition metal-containing targets (metal silicide targets), and performing reactive sputtering in a reactive gas or a gas mixture of a reactive gas and an inert gas such as argon. See JP-A 7-140635 (Patent Reference 9).

The other embodiment is an antireflective film containing as a main component a chromium compound such as a chromium oxide, chromium nitride, chromium oxynitride, chromium oxycarbide, chromium carbonitride, chromium oxide nitride carbide or the like. The chlorine dry etching which is a typical etching process for chromium compounds can cause damages to the resist as previously pointed out. If the film is used solely as an antireflective film, a film thickness of about 15 to 30 nm is sufficient, in which thickness range an antireflective film of chromium compound can be etched to completion before causing any significant damage to the resist.

The etching of this antireflective film, that is, chlorine dry etching cannot etch the light-shielding film of the invention. Once the antireflective film of chromium compound is etched, a light-shielding film containing silicon and transition metal is etched by fluorine dry etching using the antireflective film as an etch mask. Then due to the high etch resistance of chromium compound, the antireflective film functions as an etch mask so that high accuracy etching is expectable. This embodiment is preferred in the case of deep trenching at the etching stage, for example, when the mask is used as Levenson-type phase shift mask.

In this embodiment, the antireflective film preferably has an atomic composition which is set to the range of 30 to 85 atom % Cr, 0 to 60 atom % O, 0 to 50 atom % N, and 0 to 20 atom % C, and to provide an optical density OD between 0.3 and 1.5, preferably between 0.5 and 1.0, relative to exposure light when its thickness is within the range described below. Although the thickness of the antireflective film varies with the wavelength of light used for inspection necessary during fabrication or use of the photomask, the antireflection effect is generally exerted at a thickness of 15 to 30 nm. A thickness of 20 to 25 nm is preferred especially for the ArF lithography.

The antireflective film of this type can be formed by well-known methods. The method often used herein is by using a chromium target, and performing reactive sputtering in a reactive gas or a gas mixture of a reactive gas and an inert gas such as argon. See JP-A 7-140635 (Patent Reference 9).

In the photomask blank of the invention, another film different from the light-shielding film and the antireflective film may be provided between the transparent substrate and the light-shielding film, for example, an etch stop film, a translucent film, a phase shift film of MoSi or MoZrSi, or the like.

Described below is the method of producing a photomask using the photomask blank of the invention. As described above, the process of processing the photomask blank of the invention traverses some different steps depending on whether a transition metal silicide compound or a chromium compound is used for the antireflective film. Reference is first made to the embodiment wherein the antireflective film is a transition metal silicide compound.

First, a resist pattern for writing a circuitry image is formed on the photomask blank having an antireflective film of transition metal silicide compound. In this step, surface treatment is preferably carried out for reducing the surface energy of the substrate (photomask blank) surface, prior to coating of the resist. The best mode of surface treatment is by alkylsilylating the surface with hexamethylene disilazane (HMDS) or other organosilicon surface treating agents commonly used in the semiconductor manufacture process, which is preferably implemented by exposing the substrate to the treating agent gas or by directly coating the treating agent to the surface. The surface treatment minimizes the occurrence of such problems as fine pattern collapse and stripping.

Next, a resist material is coated on the surface treated substrate (photomask blank) and dried to form a resist film. An appropriate resist must be selected in accordance with the image writing system used. Preferably, positive or negative resist materials comprising aromatic skeleton-bearing polymers are used for the commonly used EB writing process, and chemically amplified resist materials are used for the micro-patterning photomask manufacture process where the invention is effectively applicable.

The resist film should have a thickness within the range where it can form a satisfactory pattern profile and function as an etch mask. Particularly when it is desired to form a fine pattern as an ArF lithography mask, the film thickness is preferably equal to or less than 350 nm, and more preferably equal to or less than 250 nm. Generally the lower limit of the resist film thickness is preferably equal to or greater than 75 nm, and more preferably equal to or greater than 100 nm, although it depends on the etch resistance of the resist. It is noted that the film thickness may be further reduced where a bilayer resist process using a silicone resin based resist in combination with an aromatic resin based bottom layer film or a surface imaging process using an aromatic chemically amplified resist in combination with a silicone base surface treating agent is utilized. Coating conditions and drying means are selected appropriate for a particular resist used.

Image writing on a resist may be performed by EB irradiation or light irradiation. In general, EB irradiation is a preferred method for forming fine patterns. Where a chemically amplified resist is used, image writing is generally performed with an energy amount in the range of 3 to 30 mC/cm$^2$, followed by heat treatment and subsequent development to form a resist pattern.

Next, using the resist pattern resulting from the above step as an etch mask, the light-shielding film is etched. In this embodiment of the antireflective film, if the etching is carried out by a well-known fluorine dry etching process, the antireflective film and the light-shielding film can be etched simultaneously. It is also possible that once the antireflective film is etched, the light-shielding film is etched by a chlorine dry etching process. In this case, a film of oxygen-rich transition metal silicide compound is not etched, but a film of oxygen-short transition metal silicide compound is etched. If the oxygen content of the antireflective film is set higher than the oxygen content of the light-shielding film, then the antireflective film can serve as an etch mask, allowing for higher accuracy processing.

After the light-shielding pattern is formed by etching, the resist is stripped off with a predetermined stripper solution, resulting in a photomask having the light-shielding film pattern formed thereon. It is noted that in the case of halftone phase shift masks or Levenson-type phase shift masks, a silicon oxide film which is a typical phase shift material or a metal silicide compound film such as metal silicide oxynitride film which is a translucent film can be simultaneously etched under the same etching conditions as is the light-shielding film. Then the invention is advantageously applicable to halftone phase shift masks and Levenson-type phase shift masks.

In the case of phase shift masks, for example, it is a common practice that a phase shift pattern is formed, after which the light-shielding film pattern is partially removed. In this case, a resist is coated again and patterned according to a standard technique, after which the antireflective film and the light-shielding film are etched away by a fluorine dry etching process. In this etching, the completion of etching of the light-shielding film can be judged by a well-known technique, for example, by detection of etched atoms or detection of reflectance. Also, when the light-shielding film is etched away by a chlorine dry etching process at the end of etching of the antireflective film as mentioned above, over-etching can be prevented. It is noted that a photomask blank of the construction free of an antireflective film can be processed by the same process as described above.

Reference is now made to the second embodiment wherein the antireflective film is a chromium compound. It is described how to produce a photomask by processing the photomask blank. The procedure taken in this embodiment until a resist pattern is obtained is the same as in the previous embodiment, i.e., a resist pattern can be formed by the same procedure as in the embodiment wherein the antireflective film is a transition metal silicide compound. The next stage is a dry etching step where etching is performed by a chlorine dry etching process, especially a chlorine dry etching process using oxygen-laden chlorine. During the chlorine dry etching, an organic film such as a resist can be etched as well, as opposed to fluorine dry etching. However, the antireflective film generally functions at a thickness of about 15 to about 30 nm, and this etching is completed in a brief time because it is intended only for the antireflective film. Then a resist film having a thickness of 100 to 250 nm can be processed at a high accuracy.

For processing at a higher accuracy, the etching of the light-shielding film is changed to fluorine-based dry etching. This type of etching of the light-shielding film ensures ease of high-accuracy processing where the chromium compound film as the antireflective film plays the role of an etch mask because the chromium compound film is not etched at all by fluorine-based dry etching. After this step, the resist is stripped by a predetermined technique, completing a photomask. Because the chromium compound based antireflective film can be used as an etch mask in processing into a Levenson-type phase shift mask or in processing into a phase shift mask having a phase shift film, for example, this procedure is advantageous when the undercoat film between the transparent substrate and the light-shielding film must be trenched deeply and accurately.

The photomask resulting from the above step is finally cleaned with sulfuric acid-hydrogen peroxide mixture and/or aqueous ammonia-hydrogen peroxide mixture, completing the photomask. If the light-shielding film does not have sufficient chemical stability to withstand cleaning conditions during the cleaning, the light-shielding film is over-removed or undercut beneath the antireflective film. This gives rise to the problem of a significant decline of mask accuracy for binary masks or tri-tone masks using high-transmittance halftone mask blanks, and also the problem of a decline of antireflection function where the light-shielding film is present only at the periphery as in the case of low-transmittance halftone masks.

In general, in chemical resistance tests of immersing for one hour in an ammonia-hydrogen peroxide mixture (aqueous ammonia:hydrogen peroxide:water=1:1:30 in volume ratio) and a sulfuric acid-hydrogen peroxide mixture (sulfuric acid:hydrogen peroxide=4:1 in volume ratio), those films that undergo a thickness change equal to or less than 5 nm, especially equal to or less than 3 nm in both the conditions are regarded satisfactory or free from the above problems. The films of the invention undergo thickness changes within the range in these chemical resistance tests, proving excellent chemical stability (or chemical resistance).

EXAMPLE

Examples and Comparative Examples are given below for illustrating the invention although the invention is not limited thereto.

Examples 1-5 & Comparative Examples 1-3

Photomask blanks having a light-shielding film deposited on a substrate were prepared by the following procedure.

Using a DC sputtering apparatus having two targets as shown in FIG. 1, a light-shielding film composed of silicon and molybdenum was deposited on a quartz substrate. Illustrated in FIG. 1 are a substrate 1, a chamber 101, targets 102a, 102b, a sputtering gas inlet 103, an exhaust port 104, a substrate rotating platform 105, and power supplies 106a, 106b.

Sputtering gases were introduced at the predetermined flow rates shown in Table 1 so as to establish a gas pressure of 0.05 Pa in the sputtering chamber. Two targets were used herein: a Mo target as the transition metal source and a Si (single crystal) target as the silicon source. The predetermined discharge powers shown in Table 1 were fed to the respective targets while the substrate was rotated at 30 rpm. In this way, a MoSi film or MoSiON film was deposited to the contents of silicon and molybdenum shown in Table 1 and to the predetermined thickness by controlling the deposition time. The contents of light elements in the resultant light-shielding film (as determined by ESCA) are also shown in Table 1.

TABLE 1

|  | Target input power (W) | | Si:Mo (atomic ratio) | Sputtering gas flow rate (sccm) | | | Light element content (atom %) | |
| --- | --- | --- | --- | --- | --- | --- | --- | --- |
|  | Si | Mo |  | Ar | $N_2$ | $O_2$ | Nitrogen | Oxygen |
| Example 1 | 920 | 80 | 9:1 | 20 | 0 | 0 | 0 | 0 |
| Example 2 | 840 | 160 | 4:1 | 20 | 0 | 0 | 0 | 0 |
| Example 3 | 940 | 60 | 15:1 | 20 | 0 | 0 | 0 | 0 |
| Example 4 | 920 | 80 | 9:1 | 20 | 5 | 2 | 11 | 7 |
| Example 5 | 920 | 80 | 9:1 | 20 | 10 | 2 | 23 | 6 |

TABLE 1-continued

|  | Target input power (W) | | Si:Mo (atomic ratio) | Sputtering gas flow rate (sccm) | | | Light element content (atom %) | |
|---|---|---|---|---|---|---|---|---|
|  | Si | Mo |  | Ar | $N_2$ | $O_2$ | Nitrogen | Oxygen |
| Comparative Example 1 | 550 | 450 | 1:1 | 20 | 0 | 0 | 0 | 0 |
| Comparative Example 2 | 720 | 280 | 2:1 | 20 | 0 | 0 | 0 | 0 |
| Comparative Example 3 | 1000 | 0 | 1:0 | 20 | 0 | 0 | 0 | 0 |

Chemical Stability (Chemical Resistance)

Samples having a light-shielding film deposited to a thickness of 39 nm were immersed for one hour in an ammonia-hydrogen peroxide mixture (aqueous ammonia:hydrogen peroxide:water=1:1:30 in volume ratio) or a sulfuric acid-hydrogen peroxide mixture (sulfuric acid:hydrogen peroxide=4:1 in volume ratio), following which a change of film thickness was determined. The results are shown in Table 2.

Electric Conductivity

For samples having a light-shielding film deposited to a thickness of 39 nm, the electric conductivity of the light-shielding film was measured by a four-probe sheet resistance meter MCP-T600 by Mitsubishi Chemical Co., Ltd. The results are shown in Table 2.

TABLE 2

|  | Film thickness reduction by ammonia - hydrogen peroxide immersion (nm) | Film thickness increase by sulfuric acid - hydrogen peroxide immersion (nm) | Conductivity (Ω/□) |
|---|---|---|---|
| Example 1 | 0.7 | 0.1 | 486 |
| Example 2 | 1.5 | 0.4 | 296 |
| Example 3 | 0.2 | 0 | 680 |
| Example 4 | 0.8 | 0 | 470 |
| Example 5 | 0.5 | 0 | 584 |
| Comparative Example 1 | film loss | 26.5 | 38 |
| Comparative Example 2 | 17.7 | 2.4 | 96 |
| Comparative Example 3 | 0.2 | 0.2 | 1082 |

Dependency of Optical Density on Film Thickness and Wavelength

Figure 2:
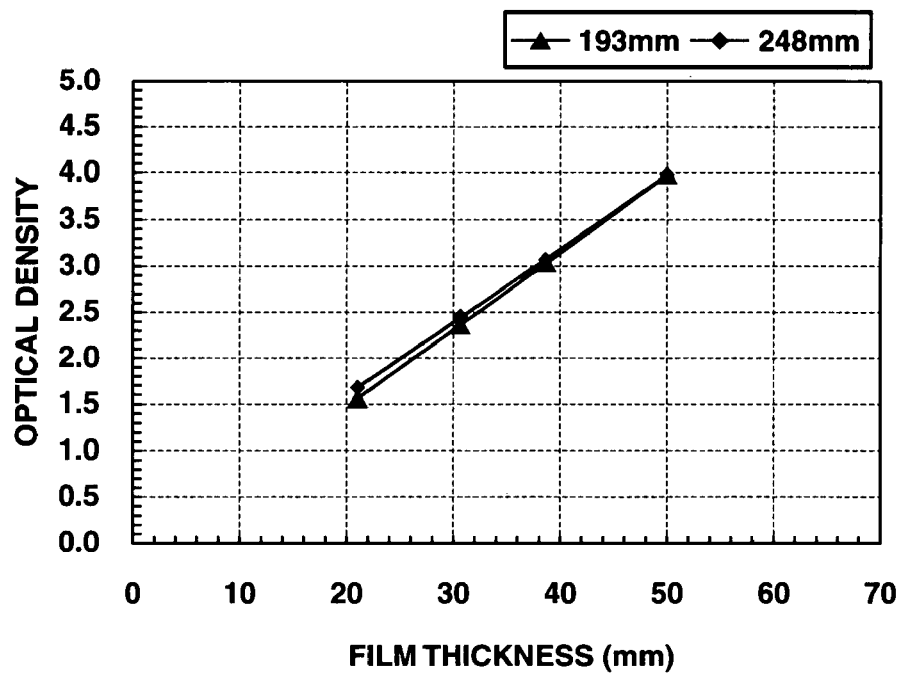
FIG. 2 is a graph showing the film thickness dependency of the optical density of a light-shielding film of Example 1 relative to light of wavelength 248 nm and 193 nm.
Figure 3:
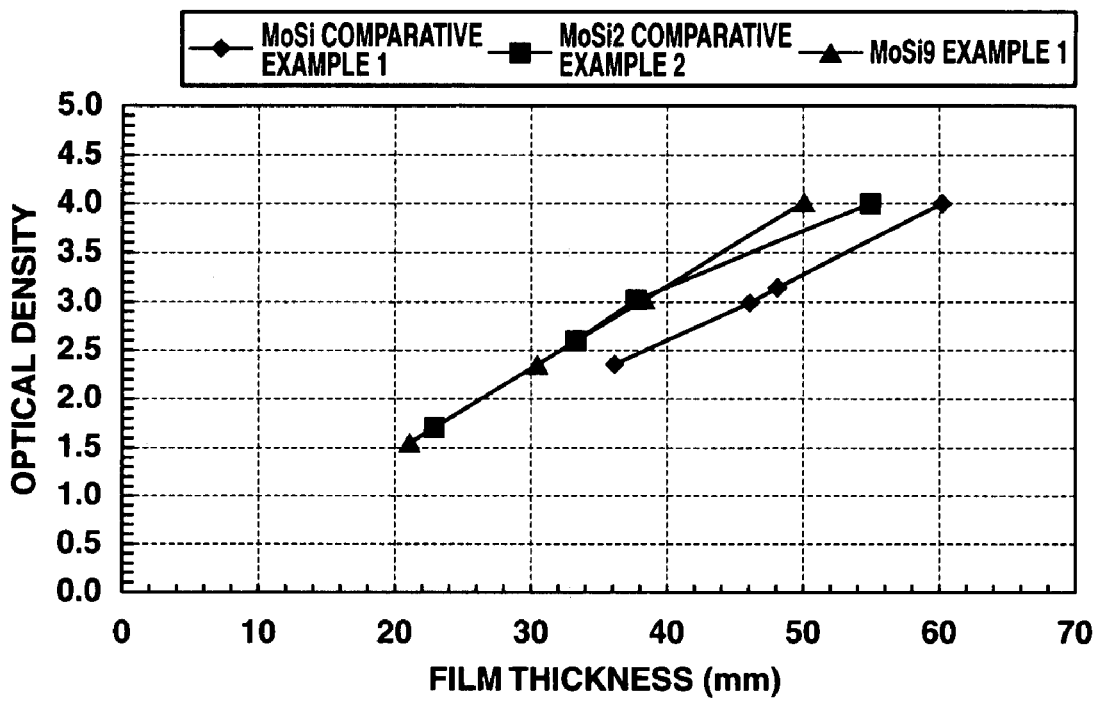
FIG. 3 is a graph showing the film thickness dependency of the optical density of light-shielding films of Example 1 and Comparative Examples 1 and 2 relative to light of wavelength 193 nm.

For samples in which a light-shielding film was deposited to the varying thickness shown in Table 3 under the above-described conditions, the optical density of the light-shielding film was measured by a spectrophotometer, provided that light was incident on the transparent substrate side. The results are shown in Table 3. FIG. 2 plots the film thickness dependency of the optical density of the light-shielding film of Example 1 relative to light of wavelength 248 nm or 193 nm. FIG. 3 plots the film thickness dependency of the optical density of the light-shielding films of Example 1 and Comparative Examples 1 and 2 relative to light of wavelength 193 nm. For reference's sake, the optical density of metallic Cr film and the film thickness dependency thereof are shown in Table 3 and FIG. 4, respectively.

TABLE 3

|  | OD at 193 nm | | | |
|---|---|---|---|---|
| Example 1 | Thickness 21 nm 1.56 | Thickness 31 nm 2.38 | Thickness 39 nm 3.05 | Thickness 50 nm 4.00 |
| Example 2 | Thickness 39 nm 3.02 | | | |
| Example 3 | Thickness 38 nm 3.08 | | | |
| Example 4 | Thickness 40 nm 2.93 | | | |
| Example 5 | Thickness 40 nm 2.88 | | | |
| Comparative Example 1 | Thickness 39 nm 2.45 | Thickness 46 nm 3.00 | Thickness 48 nm 3.15 | Thickness 60 nm 4.00 |
| Comparative Example 2 | Thickness 23 nm 1.74 | Thickness 33 nm 2.60 | Thickness 39 nm 3.05 | Thickness 55 nm 4.00 |
| Comparative Example 3 | Thickness 39 nm 3.10 | | | |
| Cr film | Thickness 14 nm 0.73 | Thickness 24 nm 1.23 | Thickness 32 nm 2.08 | Thickness 46 nm 2.76 |

Figure 4:
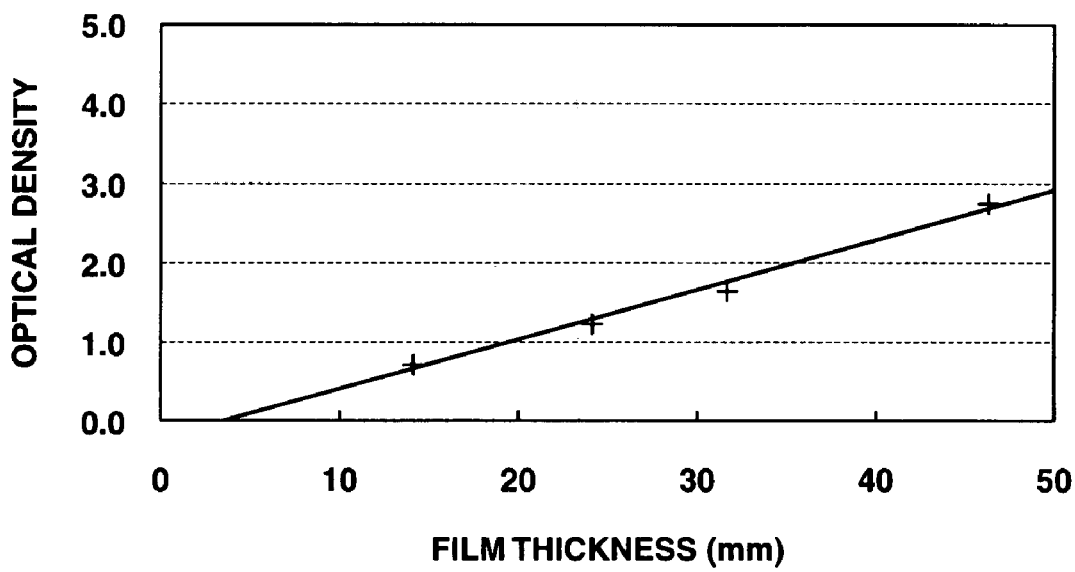
FIG. 4 is a graph showing the film thickness dependency of the optical density of a chromium film relative to light of wavelength 193 nm.

The light-shielding film of Example 1 with a thickness of approximately 40 nm has an optical density of about 3.0 both at the wavelength of 193 nm and 248 nm as seen from FIG. 2, demonstrating superior light shield to the chromium based light-shielding film (see FIG. 4). By contrast, the light-shielding film of Comparative Example 1 with a thickness of approximately 40 nm has an optical density of about 2.5 at the wavelength of 193 nm as seen from FIG. 3, demonstrating no significant difference in light shield from the metallic chromium light-shielding film (see FIG. 4). The light-shielding film of Comparative Example 3 has a high sheet resistance, failing to meet electric conductivity.

Figure 5:
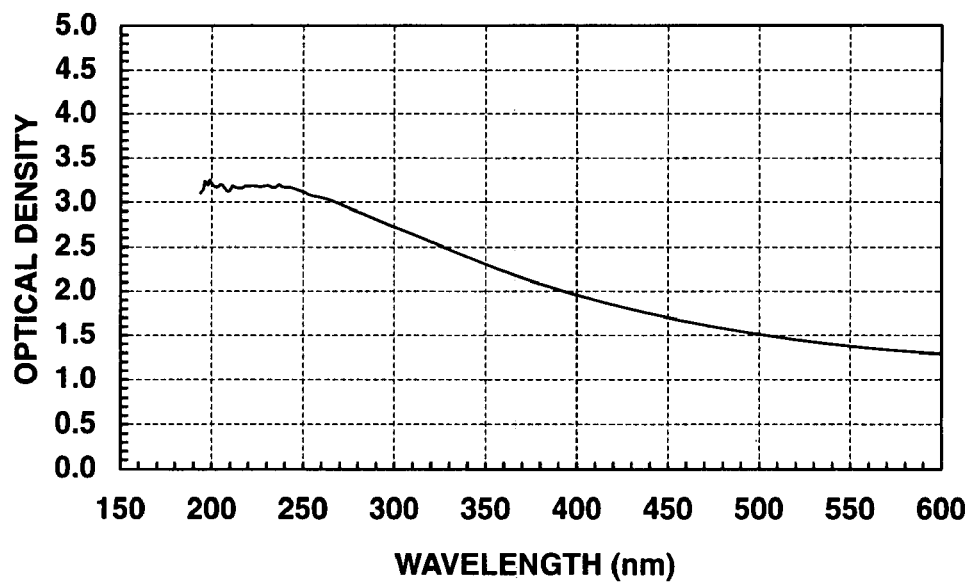
FIG. 5 is a graph showing the wavelength dependency of the optical density of a light-shielding film of Example 1.

Further, for the light-shielding film (39 nm thick) of Example 1, the wavelength dependency of its optical density was determined by a spectrophotometer. The results are shown in FIG. 5. As seen from FIG. 5, this light-shielding film has an excellent optical density on the short wavelength side, demonstrating light-shielding properties suited for DUV lithography.

It is seen from these results that in the photomask blank of the invention, its light-shielding film has an optical density of around 3 at a thickness of about 40 nm relative to light with a wavelength equal to or less than 248 nm and that the photomask blank of the invention and a photomask obtained there-from have excellent light-shielding properties as compared with those using a chromium based film as the light-shielding film. This suggests that the light-shielding film can be made thinner, the dry etching time can be reduced accordingly, and an improvement in patterning accuracy due to a thickness reduction of the resist film becomes possible. Furthermore, since the light-shielding film is fully resistant to ammonia-hydrogen peroxide mixtures and sulfuric acid-hydrogen peroxide mixtures commonly used as cleaning solution in the mask manufacture process, the photomask blank of the invention undergoes minimized pattern size variations even when cleaning steps are repeated.

Examples 6-12

Photomask blanks (binary mask blanks) having a light-shielding film and an antireflective film deposited on a substrate were prepared by the following procedure.

Antireflective Film of Molybdenum Silicide Compound (Examples 6-9)

First, a light-shielding film (Si:Mo=9:1 in atomic ratio) having a thickness of 25 nm was deposited under the same conditions as in Example 1.

Next, using a DC sputtering apparatus having two targets as shown in FIG. 1, an antireflective film of molybdenum silicide nitride was deposited on the light-shielding film. Sputtering gases, Ar gas at a flow rate of 5 sccm, $N_2$ gas at 50 sccm, and $O_2$ gas at 0.2 sccm were introduced so as to establish a gas pressure of 0.1 Pa in the sputtering chamber. Two targets were used herein: a Mo target as the transition metal source and a Si (single crystal) target as the silicon source. Discharge powers of 150 W and 850 W were fed to the Mo and Si targets, respectively, while the substrate was rotated at 30 rpm. In this way, a MoSiN film was deposited so as to contain silicon and molybdenum in a Si:Mo ratio of 4.5:1 (atomic ratio) and to the thickness shown in Table 4 by controlling the deposition time.

Antireflective Film of Chromium Compound (Examples 10-12)

First, a light-shielding film (Si:Mo=9:1 in atomic ratio) having a thickness of 39 nm was deposited under the same conditions as in Example 1.

Next, using a standard magnetron DC sputtering apparatus having a single target, an antireflective film of chromium oxynitride was deposited on the light-shielding film. Sputtering gases, Ar gas at a flow rate of 10 sccm, $N_2$ gas at 30 sccm, and $O_2$ gas at 15 sccm were introduced so as to establish a gas pressure of 0.1 Pa in the sputtering chamber. The target used herein was a Cr target. A discharge power of 1,000 W was fed to the Cr target while the substrate was rotated at 30 rpm. In this way, a CrON film was deposited to the thickness shown in Table 4 by controlling the deposition time.

TABLE 4

| | Light-shielding film | Thickness (nm) | Antireflective film | Thickness (nm) |
|---|---|---|---|---|
| Example 6 | MoSi film | 25 | MoSiN film | 19 |
| Example 7 | Si:Mo = 9:1 | | Si:Mo = 4.5:1 | 23 |
| Example 8 | | | | 28 |
| Example 9 | | | | 37 |
| Example 10 | | 39 | CrON film | 15 |
| Example 11 | | | | 20 |
| Example 12 | | | | 30 |

Optical Density

For the above-prepared photomask blanks, the optical density (OD) of the light-shielding film was measured by a spectrophotometer, provided that light was incident on the transparent substrate side. The results are shown in Table 5. An optical density of around 3.0 relative to light of wavelength 193 nm is obtained when the antireflective film has a thickness of 23 nm (summing to 48 nm, combined with the light-shielding film). This, in view of the fact that a chromium based light-shielding film must be generally thick enough to give a total thickness of about 56 nm in order to provide an optical density of 3.0, suggests that the photomask blank of the invention allows for film thickness reduction even when a light-shielding film and an antireflective film are laminated.

Dependency of Reflectance on Thickness and Wavelength

Figure 6:
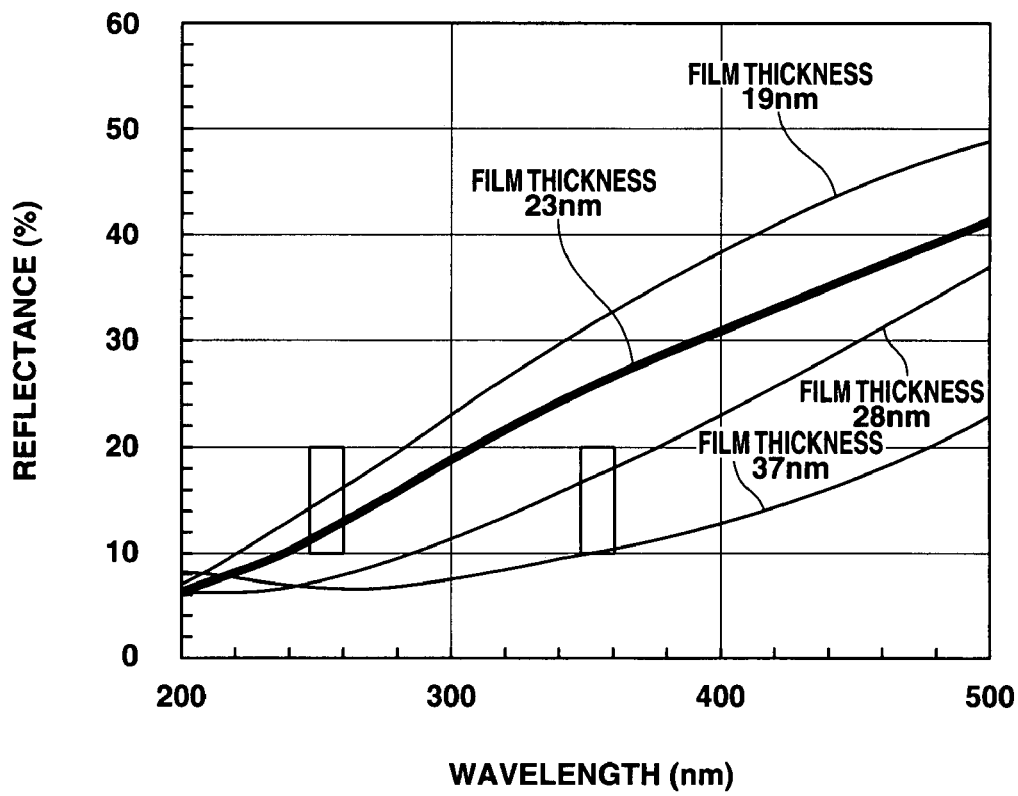
FIG. 6 is a graph showing the wavelength dependency of the reflectance of antireflective films on photomask blanks of Examples 6-9.

For the photomask blanks of Examples 6-10, the wavelength dependency of reflectance was determined by a spectrophotometer, provided that light was incident on the film surface side. The results are shown in Table 5 and FIG. 6. As seen from Table 5 and FIG. 6, a reflectance of 10 to 20% is obtained at the wavelength 257 nm or 365 nm when the antireflective film has a thickness in the range of 19 to 37 nm, proving a possibility of inspection with a commercially available defect detector.

TABLE 5

| | | Reflectance (%) | |
|---|---|---|---|
| | OD | Wavelength 257 nm | Wavelength 365 nm |
| Example 6 | 2.78 | 15.6 | 33.7 |
| Example 7 | 3.00 | 12.5 | 27.4 |
| Example 8 | 3.22 | 7.7 | 18.7 |
| Example 9 | 3.66 | 6.5 | 10.8 |
| Example 10 | 3.72 | 17.7 | 25.2 |
| Example 11 | 3.94 | 15.5 | 19.0 |
| Example 12 | 4.39 | 16.0 | 14.2 |

Chemical Stability (Chemical Resistance)

The photomask blanks were immersed for one hour in an ammonia-hydrogen peroxide mixture (aqueous ammonia:hydrogen peroxide:water=1:1:30 in volume ratio) or a sulfuric acid-hydrogen peroxide mixture (sulfuric acid:hydrogen peroxide=4:1 in volume ratio). A change of reflectance was determined by a spectrophotometer UV-2400PC (Shimadzu Corp.). Under both the conditions, the change of reflectance at wavelength 365 nm was less than 1%, demonstrating the elimination of any practical problems.

Dry Etching

On the photomask blank of Example 6, a resist pattern was formed by EB lithography using a chemically amplified resist (film thickness 180 nm). Using the resist pattern as an etch mask, $CF_4$ dry etching was carried out ($CF_4$=80 sccm, 60 W, 2 Pa). A cross-section of the resulting structure was observed under a scanning electron microscope. As a result, the shape of the etched cross-section was satisfactory, and no steps were found between the light-shielding film and the antireflective film, proving that the light-shielding film and the antireflective film can be patterned in one step by fluorine dry etching.

Separately, on the photomask blank of Example 10, a resist pattern was formed by EB lithography using a chemically amplified resist (film thickness 100 nm). The CrON antireflective film was patterned by chlorine/oxygen dry etching ($Cl_2$=80 sccm, $O_2$=2 sccm, 60 W, 2 Pa). A cross-section of the resulting structure was observed under a scanning electron microscope. As a result, the shape of the etched cross-section was satisfactory, demonstrating no significant invasion of the light-shielding film by etching. Next, the resist was removed from the blank in which the CrON antireflective film had been patterned, and fluorine dry etching was then carried out ($CF_4$=80 sccm, 60 W, 2 Pa). As a result, the shape of the etched cross-section was satisfactory, and no steps were found between the light-shielding film and the antireflective film. It is seen from these results that the CrON antireflective film can serve as a hard mask when the light-shielding film is patterned.

From the foregoing results, it is seen that the necessary thickness of the resist used in producing a photomask from the photomask blank of the invention can be dramatically reduced.

Example 13

A halftone phase shift mask blank was fabricated and then processed into a halftone phase shift mask as follows.

At the start, a first layer of 10 nm thick was deposited on a quartz substrate of 6 inch square by a sputtering deposition process, specifically by using a $MoZrSi_4$ sintered body and a Si single crystal as sputtering targets, feeding a discharge power of 560 W and 1,000 W to the $MoZrSi_4$ and Si targets, respectively, and rotating the substrate at 30 rpm. During the process, a gas mixture of 8 sccm of Ar, 20 sccm of $N_2$, and 5 sccm of $O_2$ was introduced as the sputtering gas. The gas pressure during sputtering was set at 0.15 Pa.

Then, a second layer of 40 nm thick as shown in Table 1 was deposited while changing the discharge powers so as to apply 430 W to the $MoZrSi_4$ target and 1,000 W to the Si target, changing the sputtering gas to a gas mixture of 15 sccm of Ar, 100 sccm of $N_2$, and 1 sccm of $O_2$, rotating the substrate at 30 rpm, and setting a gas pressure of 0.25 Pa.

Further, a third layer of 20 nm thick was deposited while changing the discharge powers so as to apply 430 W to the $MoZrSi_4$ target and 1,000 W to the Si target, changing the sputtering gas to a gas mixture of 5 sccm of Ar, 50 sccm of $N_2$, and 1 sccm of $O_2$, rotating the substrate at 30 rpm, and setting a gas pressure of 0.1 Pa. A halftone phase shift film was obtained in this way.

Next, on the halftone phase shift film, a light-shielding film of molybdenum silicide and an antireflective film of molybdenum silicide nitride as in Example 6 were overcoated by the same procedure as in Example 6 to a thickness of 10 nm for the light-shielding film and 20 nm for the antireflective film. This yielded a halftone phase shift mask blank having a light-shielding film and an antireflective film laminated thereon.

On the halftone phase shift mask blank, a resist pattern was formed by EB lithography using a chemically amplified resist (film thickness 250 nm). Using the resist pattern as an etch mask, $CF_4$ dry etching was carried out ($CF_4$=80 sccm, 60 W, 2 Pa) for etching the antireflective film, light-shielding film and halftone phase shift film. The endpoint of etching was detected from a reflectance change while monitoring a reflectance.

Next, to etch the light-shielding film on the halftone phase shift pattern, the resist pattern was first stripped by a standard technique, and a negative resist was coated to form a resist film again. Pattern irradiation was carried out to an outer frame portion where a light-shielding pattern was to be left, after which light was irradiated to the entire surface of the substrate being processed from the backside in order to protect the portion of the substrate surface where the halftone pattern had already been etched away. The resist film was developed, forming a resist pattern that the resist was left only in the outer frame portion and the portion where the halftone pattern was absent. Using the resist pattern as an etch mask, $CF_4$ dry etching was carried out ($CF_4$=80 sccm, 60 W, 2 Pa). At the point of time when the antireflective film had been etched, the light-shielding film was etched by $Cl_2$ dry etching ($Cl_2$=80 sccm, 60 W, 2 Pa). For each of the films, the endpoint of etching was detected from a reflectance change while monitoring a reflectance.

A cross section of the mask pattern was observed under a scanning electron microscope, finding a satisfactory etched shape. The halftone phase shift film was also found acceptable in phase and transmittance.

Example 14

By the same procedure as in Example 13, a halftone phase shift film was deposited on a quartz substrate. On this halftone phase shift film, a light-shielding film of molybdenum silicide and an antireflective film of chromium oxynitride as in Example 10 were overcoated by the same procedure as in Example 10 to a thickness of 10 nm for the light-shielding film and 20 nm for the antireflective film. This yielded a halftone phase shift mask blank having a light-shielding film and an antireflective film laminated thereon.

On the halftone phase shift mask blank, a resist pattern was formed by EB lithography using a chemically amplified resist (film thickness 100 nm). Using the resist pattern as an etch mask, chlorine/oxygen dry etching was carried out ($Cl_2$=80 sccm, $O_2$=2 sccm, 60 W, 2 Pa) for patterning the CrON antireflective film. Then $CF_4$ dry etching was carried out ($CF_4$=80 sccm, 60 W, 2 Pa) for etching the light-shielding film and halftone phase shift film.

Next, the resist pattern was stripped by a standard technique, and a resist film was formed again. A resist pattern was formed so that the resist was left only where a light-shielding pattern was to be left. Using this resist pattern as an etch mask, chlorine/oxygen dry etching as above was carried out to etch the antireflective film, after which the light-shielding film was etched by $Cl_2$ dry etching ($Cl_2$=80 sccm, 60 W, 2 Pa). For each of the films, the endpoint of etching was detected from a reflectance change while monitoring a reflectance.

A cross section of the mask pattern was observed under a scanning electron microscope, finding a satisfactory etched shape. The halftone phase shift film was also found acceptable in phase and transmittance.

The invention claimed is:

1. A photomask blank, from which a photomask comprising a transparent substrate and a mask pattern formed thereon including transparent regions and effectively opaque regions to exposure light can be produced, comprising:
   a transparent substrate; and
   a light-shielding film and an antireflective film in the form of a binary mask blank, wherein
   the light-shielding film and the antireflective film are formed on the transparent substrate with or without another film (A) intervening therebetween,
   the light-shielding film comprises one or more layers, at least one layer (B) of the layers containing silicon and a transition metal as main components,
   the silicon and the transition metal are present at a silicon/metal molar ratio of 4/1 to 15/1, and
   combination of the light-shielding film and the antireflective film has an optical density of at least 2.5.

2. The photomask blank of claim 1, wherein the transition metal is molybdenum.

3. The photomask blank of claim 1 or 2, wherein the at least one layer (B) of the layers of which the light-shielding film is composed further contains at least one element selected from oxygen, nitrogen and carbon.

4. The photomask blank of claim 1, wherein said light-shielding film has a thickness of 20 to 50 nm.

5. The photomask blank of claim 1, wherein said light-shielding film is overlaid with an antireflective film, and the antireflective film contains as a main component a transition metal silicide oxide, transition metal silicide nitride, transition metal silicide oxynitride, transition metal silicide oxycarbide, transition metal silicide carbonitride or transition metal silicide oxide nitride carbide.

6. The photomask blank of claim 5, wherein the transition metal silicide is molybdenum silicide.

7. The photomask blank of claim 1, wherein said light-shielding film is overlaid with an antireflective film, and the antireflective film contains as a main component a chromium oxide, chromium nitride, chromium oxynitride, chromium oxycarbide, chromium carbonitride or chromium oxide nitride carbide.

8. A photomask comprising a transparent substrate and a mask pattern formed thereon including transparent regions and effectively opaque regions to exposure light, which is produced from the photomask blank of claim 1.

* * * * *

UNITED STATES PATENT AND TRADEMARK OFFICE
CERTIFICATE OF CORRECTION

| | |
|---|---|
| PATENT NO. | : 7,691,546 B2 |
| APPLICATION NO. | : 11/662183 |
| DATED | : April 6, 2010 |
| INVENTOR(S) | : Hiroki Yoshikawa et al. |

It is certified that error appears in the above-identified patent and that said Letters Patent is hereby corrected as shown below:

ON THE TITLE PAGE:

Change item (73), Assignee, to read as follows:

-- (73)   Assignees: Shin-Etsu Chemical Co., Ltd., Tokyo (JP); Toppan Printing Co., Ltd., Tokyo (JP) --.

Signed and Sealed this
Seventeenth Day of May, 2011

David J. Kappos
*Director of the United States Patent and Trademark Office*